(12) United States Patent
Shu et al.

(10) Patent No.: US 9,360,524 B2
(45) Date of Patent: Jun. 7, 2016

(54) TESTING SYSTEM FOR SERIAL INTERFACE

(71) Applicant: ScienBiziP Consulting (Shen Zhen) Co., Ltd., Shenzhen (CN)

(72) Inventors: Shou-Li Shu, Shenzhen (CN); Wen-Min Huang, Shenzhen (CN)

(73) Assignee: ScienBiziP Consulting(Shenzhen)Co., Ltd., Shenzhen (CN)

(*) Notice: Subject to any disclaimer, the term of this patent is extended or adjusted under 35 U.S.C. 154(b) by 158 days.

(21) Appl. No.: 14/305,188

(22) Filed: Jun. 16, 2014

(65) Prior Publication Data
US 2014/0380111 A1   Dec. 25, 2014

(30) Foreign Application Priority Data

Jun. 19, 2013   (CN) .................. 2013 1 02424530

(51) Int. Cl.
*G01R 31/28* (2006.01)
*G01R 31/319* (2006.01)
*G01R 31/3187* (2006.01)

(52) U.S. Cl.
CPC ...... *G01R 31/31905* (2013.01); *G01R 31/3187* (2013.01)

(58) Field of Classification Search
CPC ................ G01R 31/31095; G01R 31/31903; G01R 31/31901; G01R 31/3187

USPC ............................ 714/734, 733, 724, 742, 30
See application file for complete search history.

(56) References Cited

U.S. PATENT DOCUMENTS

| 6,014,763 | A  | * | 1/2000 | Dhong | ........... G01R 31/318572 714/724 |
| 7,076,391 | B1 | * | 7/2006 | Pakzad | ................ G11B 25/043 324/210 |
| 2008/0293167 | A1 | * | 11/2008 | Wada | ................... G01R 31/286 438/15 |
| 2011/0258492 | A1 | * | 10/2011 | Fan | ....................... G06F 11/221 714/43 |

* cited by examiner

*Primary Examiner* — Chrisitne Tu
(74) *Attorney, Agent, or Firm* — Novak Druce Connolly Bove + Quigg LLP

(57) ABSTRACT

A testing system includes a circuit board, and an inserting unit. The circuit board includes a first serial interface and a serial chip connected to the first serial interface. The first serial interface connects a second serial interface of a motherboard to receive a first signal of the second serial interface. The inserting unit includes a first plug connected to a pin Transmit Data of the first serial interface. The first plug connects a testing device. When the first signal is transmitted to the first serial interface by the second serial interface, the serial chip receives the first signal and sends the first signal back to the first serial interface. The first plug sends a second signal of the pin Transmit Data to the testing device to be tested.

20 Claims, 2 Drawing Sheets

TESTING SYSTEM FOR SERIAL INTERFACE

FIELD

The present disclosure relates to testing systems, and particularly to a testing system for a serial interface.

BACKGROUND

After assembling a circuit board into an electronic device, an overall test is required to check the functions of the circuit board. The test mainly tests for defects such as an open circuit or short circuit, as well as for any substandard connections between the components under normal voltage, overvoltage, under-voltage conditions, or a serial interface. For example, a conventional testing system comprises an oscilloscope and a testing device connected to the oscilloscope. The circuit board comprises a serial interface and a plurality of pins corresponding to the serial interface. The oscilloscope is used to connect to the plurality of pins one by one by manually to be tested by the testing device.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example, and not by way of limitation, in the figures of the accompanying drawings in which like references indicate similar elements. It should be noted that references to "an" or "one" embodiment in this disclosure are not necessarily to the same embodiment, and such references mean at least one.

Figure 1:
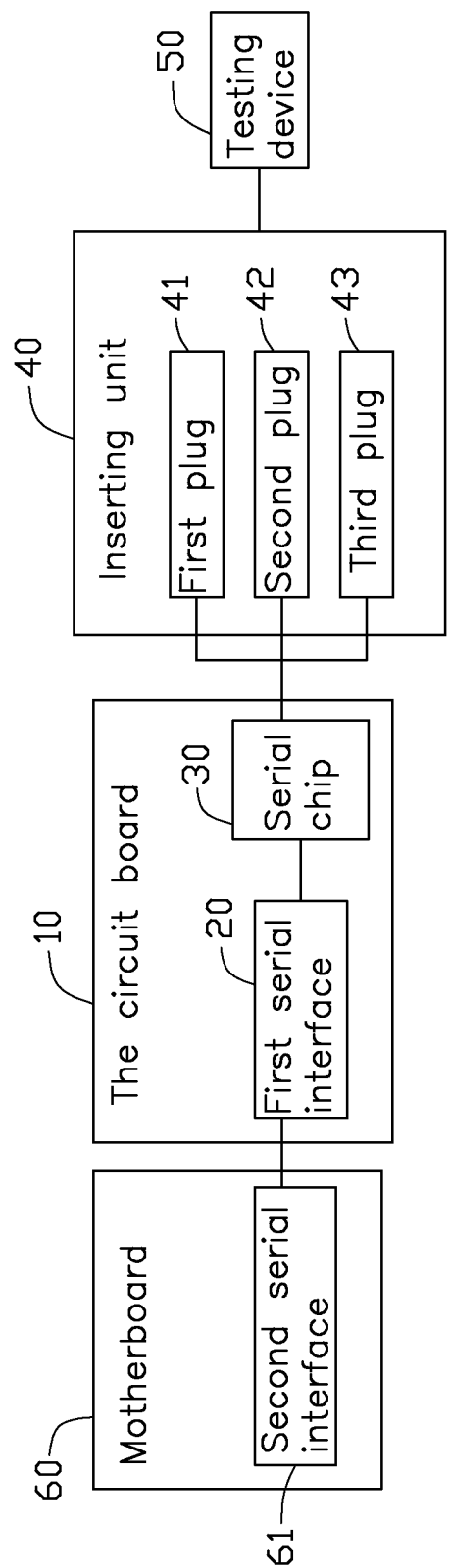
FIG. 1 is a block diagram of a testing system.
Figure 2:
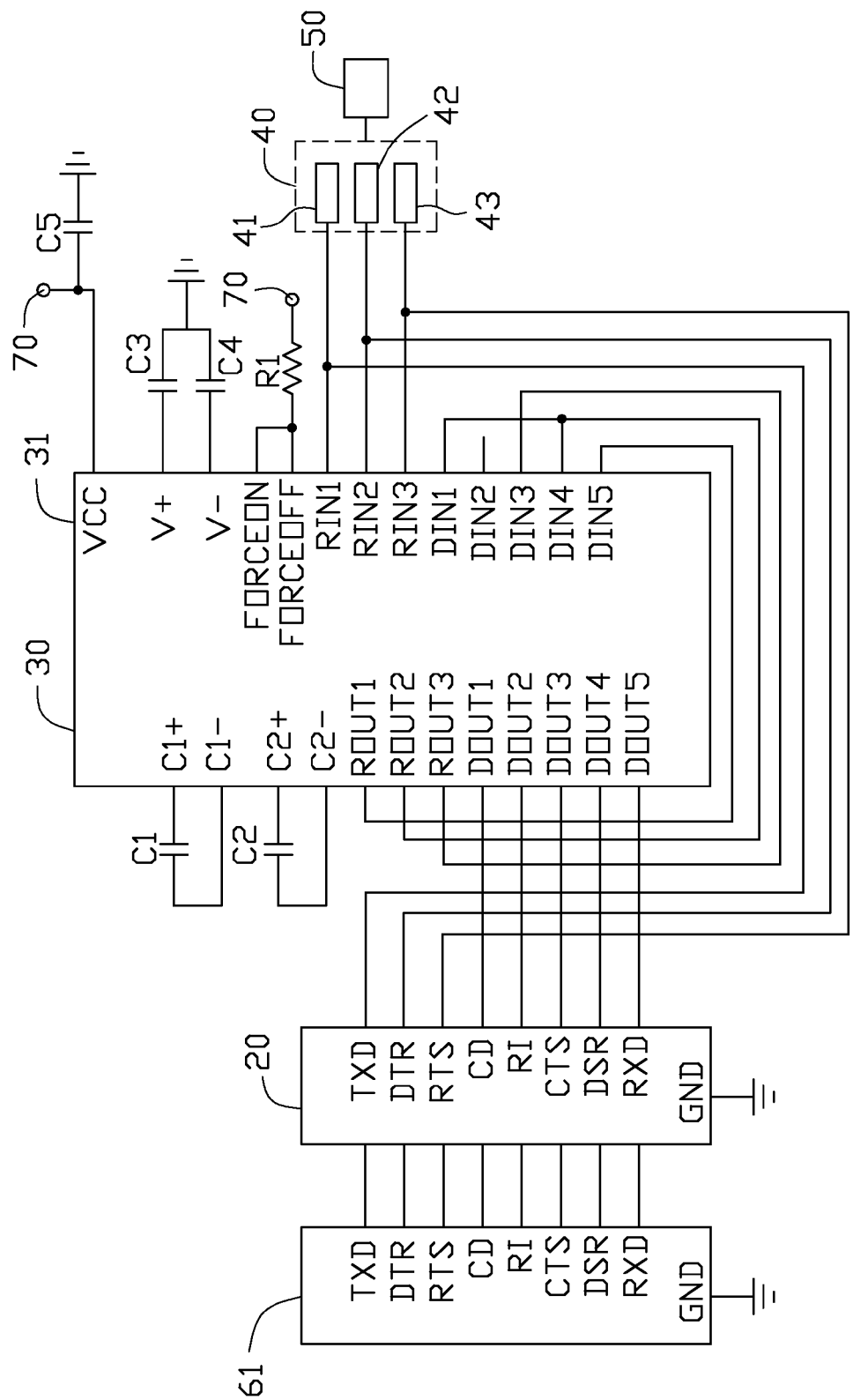
FIG. 2 is a detailed circuit diagram of the testing system of FIG. 1.

FIGS. 1-2 illustrate a testing system. The testing system comprises a circuit board 10, a motherboard 60 connected to the circuit board 10, a inserting unit 40 connected to the circuit board 10, and a testing device 50 connected to the inserting unit 40.

The circuit board 10 comprises a first serial interface 20 and a serial chip 30 connected to the first serial interface 20. The motherboard 60 comprises a second serial interface 61 connected to the first serial interface 20. The inserting unit 40 comprises a first plug 41, a second plug 42, and a third plug 43. The first, second and third plugs 41, 42, 43 are connected to the serial chip 30 and the testing device 50. In at least one embodiment, the serial chip 30 is a MAX3238 or other chips, and the testing device 50 is an oscilloscope (OSC).

The first serial interface 20 and the second serial interface 61 have a same configuration. Each of the first serial interface 20 and the second serial interface 61 comprises a pin Transmit Data (TXD), a pin Data Terminal Ready (DTR), a pin Request To Send (RTS), a pin Carrier Detect (CD), a pin Ring Indicator (RI), a pin Clear To Send (CTS), a pin Data Set Ready (DSR), a pin Receive Data (RXD), and a grounded pin (GND). The pin TXD, the pin DTR, the pin RTS, the pin CD, the pin RI, the pin CTS, the pin DSR, and the pin RXD of the first serial interface 20 are connected to the pin TXD, the pin DTR, the pin RTS, the pin CD, the pin RI, the pin CTS, the pin DSR, and the pin RXD of the second serial interface 61, respectively.

The pin TXD, the pin DTR, and the pin RTS of the first serial interface 20 are connected to a first pin Receive Input (pin RIN1), a second pin Receive Input (pin RIN2), and a third pin Receive Input (pin RIN3) of the serial chip 30, respectively. The pin RIN1, the pin RIN2, and the pin RIN3 of the serial chip 30 are connected to the first plug 41, the second plug 42 and the third plug 43, respectively. The pin CD, the pin RI, the pin CTS, the pin DSR, and the pin RXD of the first serial interface 20 are connected to a first pin Data Output (pin DOUT1), a second pin Data Output (pin DOUT2), a third pin Data Output (pin DOUT3), a fourth pin Data Output (pin DOUT4), and a fifth pin Data Output (pin DOUT5) of the serial chip 30, respectively.

A first Receive Output (pin ROUT1), a second Receive Output (pin ROUT2), a third Receive Output (pin ROUT3) are connected to a fifth Data Input (pin DIN5), a first Data Input (pin DIN1), and a third Data Input (pin DIN3) of the serial chip 30. A fourth Data Input (pin DIN4) of the serial chip 30 is connected to the pin DIN1 of the serial chip 30.

A positive pole of a first capacitor C1 is connected to a pin C1+ (first capacitor positive terminal) of the serial chip 30, and a negative pole of the first capacitor C1 is connected to a pin C1− (first capacitor negative terminal) of the serial chip 30. A positive pole of a second capacitor C2 is connected to a pin C2+ (second capacitor positive terminal) of the serial chip 30, and a negative pole of the second capacitor C2 is connected to a pin C2− (second capacitor negative terminal) of the serial chip 30. A positive pole of a third capacitor C3 is connected to a pin V+ (voltage positive terminal) of the serial chip 30, and a negative pole of third capacitor C3 is grounded. A positive pole of a fourth capacitor C4 is connected to a pin V− (voltage negative terminal) of the serial chip 30, and a negative pole of fourth capacitor C4 is grounded. A pin FORCEON of the serial chip 30 is connected to a pin FORCEOFF of the serial chip 30. The pin FORCEOFF is further connected to a power supply 70 via a resistor R1. A pin VCC 31 of the serial chip 30 is connected to the power supply 70. A positive pole of a fifth capacitor C5 is connected to the pin VCC of the serial chip 30, and a negative pole of fifth capacitor C5 is grounded.

In use, the testing device 50 is connected to the inserting unit 40. The motherboard 60 sends a signal to the second serial interface 61, and the second serial interface 61 sends the signal to the first serial interface 20. The signal is transmitted to the serial chip 30 by the first serial interface 20. Then, the signal is transmitted back to the second serial interface 61 via the first serial interface 20. The signal from the pin TXD to the first plug 41, the signal from the pin DTR to the second plug 42, the signal from pin DTS to the third plug 43 can be detected by the testing device 50.

It is to be understood, however, that even though numerous characteristics and advantages have been set forth in the foregoing description of embodiments, together with details of the structures and functions of the embodiments, the disclosure is illustrative only and changes may be made in detail, including in matters of shape, size, and arrangement of parts within the principles of the disclosure to the full extent indicated by the broad general meaning of the terms in which the appended claims are expressed.

What is claimed is:

1. A testing system comprising:
   a circuit board comprising a first serial interface and a serial chip connected to the first serial interface; the first serial interface is configured to connect a second serial interface of a motherboard to receive a first signal of the second serial interface; and an inserting unit comprising a first plug connected to a pin Transmit Data of the first serial interface; the first plug is configured to connect a testing device;

wherein when the first signal is transmitted to the first serial interface by the second serial interface, the serial chip is configured to receive the first signal sent by the first serial interface and send the first signal back to the first serial interface, and the first plug is configured to send a second signal of the pin Transmit Data to the testing device to be tested.

2. The testing system of claim 1, wherein the inserting unit further comprises a second plug connected to a pin Data Terminal Ready of the first serial interface, and the second plug is configured to connect the testing device for sending a third signal of the pin Data Terminal Ready to the testing device.

3. The testing system of claim 2, wherein the inserting unit further comprises a third plug connected to a pin Request To Send of the first serial interface, and the third plug is configured to connect the testing device for sending a fourth signal of the pin Request To Send to the testing device.

4. The testing system of claim 3, wherein the pin Transmit Data, the pin Data Terminal Ready, and the Request To Send of the first serial interface are connected to a first pin Receive Input, a second pin Receive Input, and a third pin Receive Input of the serial chip, respectively.

5. The testing system of claim 4, wherein the first pin Receive Input, the second pin Receive Input, and the third pin Receive Input of the serial chip are connected to the first plug, the second plug and the third plug, respectively.

6. The testing system of claim 1, wherein a first Receive Output, a second Receive Output, a third Receive Output are connected to a fifth Data Input, a first Data Input, and a third Data Input of the serial chip, and a fourth Data Input of the serial chip is connected to a pin DIN1 of the serial chip.

7. The testing system of claim 1, wherein a pin Carrier Detect, a pin Ring Indicator, a pin Clear To Send, a pin Data Set Ready, and a pin Receive Data of the first serial interface are connected to a first pin Data Output, a second pin Data Output, a third pin Data Output, a fourth pin Data Output, and a fifth pin Data Output of the serial chip, respectively.

8. The testing system of claim 1, wherein a positive pole of a first capacitor is connected to a first capacitor positive terminal of the serial chip, a negative pole of the first capacitor is connected to the first capacitor positive terminal of the serial chip, a positive pole of a second capacitor is connected to a second capacitor positive terminal of the serial chip, and a negative pole of the second capacitor is connected to the second capacitor positive terminal of the serial chip.

9. The testing system of claim 1, wherein a positive pole of a third capacitor is connected to a voltage positive terminal of the serial chip, a negative pole of the third capacitor is grounded, a positive pole of a fourth capacitor is connected to a voltage negative terminal of the serial chip, and a negative pole of the fourth capacitor is grounded.

10. The testing system of claim 1, wherein the serial chip is MAX3238.

11. A testing system comprising:
a circuit board comprising a first serial interface and a serial chip connected to the first serial interface; the first serial interface is configured to connect a second serial interface of a motherboard to receive a first signal of the second serial interface; and an inserting unit comprising a first plug connected to a pin Transmit Data of the first serial interface and connected to a first pin Receive Input of the serial chip; the first plug is configured to connect a testing device;

wherein the first signal is transmitted to the serial chip via the first serial interface, and the first signal received by the serial chip is sent back to the first serial interface via the serial chip, and the first plug is configured to send a second signal of the pin Transmit Data to the testing device to be tested.

12. The testing system of claim 11, wherein the inserting unit further comprises a second plug connected to a pin Data Terminal Ready of the first serial interface, and the second plug is configured to connect the testing device for sending a third signal of the pin Data Terminal Ready to the testing device.

13. The testing system of claim 12, wherein the inserting unit further comprises a third plug connected to a pin Request To Send of the first serial interface, and the third plug is configured to connect the testing device for sending a fourth signal of the pin Request To Send to the testing device.

14. The testing system of claim 13, wherein the pin Transmit Data is connected to the first pin Receive Input of the serial chip, and the pin Data Terminal Ready and the Request To Send of the first serial interface are connected to a second pin Receive Input and a third pin Receive Input of the serial chip, respectively.

15. The testing system of claim 14, wherein the first pin Receive Input, the second pin Receive Input, and the third pin Receive Input of the serial chip are connected to the first plug, the second plug and the third plug, respectively.

16. The testing system of claim 11, wherein a first Receive Output, a second Receive Output, a third Receive Output are connected to a fifth Data Input, a first Data Input, and a third Data Input of the serial chip, and a fourth Data Input of the serial chip is connected to a pin DIN1 of the serial chip.

17. The testing system of claim 11, wherein a pin Carrier Detect, a pin Ring Indicator, a pin Clear To Send, a pin Data Set Ready, and a pin Receive Data of the first serial interface are connected to a first pin Data Output, a second pin Data Output, a third pin Data Output, a fourth pin Data Output, and a fifth pin Data Output of the serial chip, respectively.

18. The testing system of claim 11, wherein a positive pole of a first capacitor is connected to a first capacitor positive terminal of the serial chip, a negative pole of the first capacitor is connected to the first capacitor positive terminal of the serial chip, a positive pole of a second capacitor is connected to a second capacitor positive terminal of the serial chip, and a negative pole of the second capacitor is connected to the second capacitor positive terminal of the serial chip.

19. The testing system of claim 11, wherein a positive pole of a third capacitor is connected to a voltage positive terminal of the serial chip, a negative pole of the third capacitor is grounded, a positive pole of a fourth capacitor is connected to a voltage negative terminal of the serial chip, and a negative pole of the fourth capacitor is grounded.

20. The testing system of claim 11, wherein the serial chip is MAX3238.

* * * * *